(12) United States Patent
Dillon et al.

(10) Patent No.: US 6,800,882 B2
(45) Date of Patent: Oct. 5, 2004

(54) MULTIPLE-BIT MEMORY LATCH CELL FOR INTEGRATED CIRCUIT GATE ARRAY

(75) Inventors: Michael N. Dillon, Richfield, MN (US); Bret A. Oeltjen, Elko, MN (US)

(73) Assignee: LSI Logic Corporation, Milpitas, CA (US)

( * ) Notice: Subject to any disclaimer, the term of this patent is extended or adjusted under 35 U.S.C. 154(b) by 1 day.

(21) Appl. No.: 10/376,837

(22) Filed: Feb. 28, 2003

(65) Prior Publication Data

US 2004/0169205 A1 Sep. 2, 2004

(51) Int. Cl.[7] .............................................. H01L 27/10
(52) U.S. Cl. ..................... 257/204; 257/206; 257/401; 257/903
(58) Field of Search ................................ 257/204, 206, 257/369, 401, 903

(56) References Cited

U.S. PATENT DOCUMENTS 6,043,521 A * 3/2000 Shibutani et al. ........... 257/206

* cited by examiner

Primary Examiner—Mark V. Prenty
(74) Attorney, Agent, or Firm—Westman, Champlin & Kelly

(57) ABSTRACT

A gate array integrated circuit is provided, which includes first and second voltage supply rails and a row of P-channel type transistors and adjacent N-channel type transistors located between first and second voltage supply rails. Adjacent ones of the P-channel and N-channel transistors have common control terminals. A multiple-bit memory cell is fabricated in the row and includes first and second latches, a read output, a first pass gate coupled between the first latch and the read output, and a second pass gate coupled between the second latch and the read output. The first pass gate includes a first one of the P-channel or N-channel transistors. The second pass gate includes a second one of the same type of the P-channel or N-channel transistors. The first and second same type transistors share a common diffusion region.

16 Claims, 4 Drawing Sheets

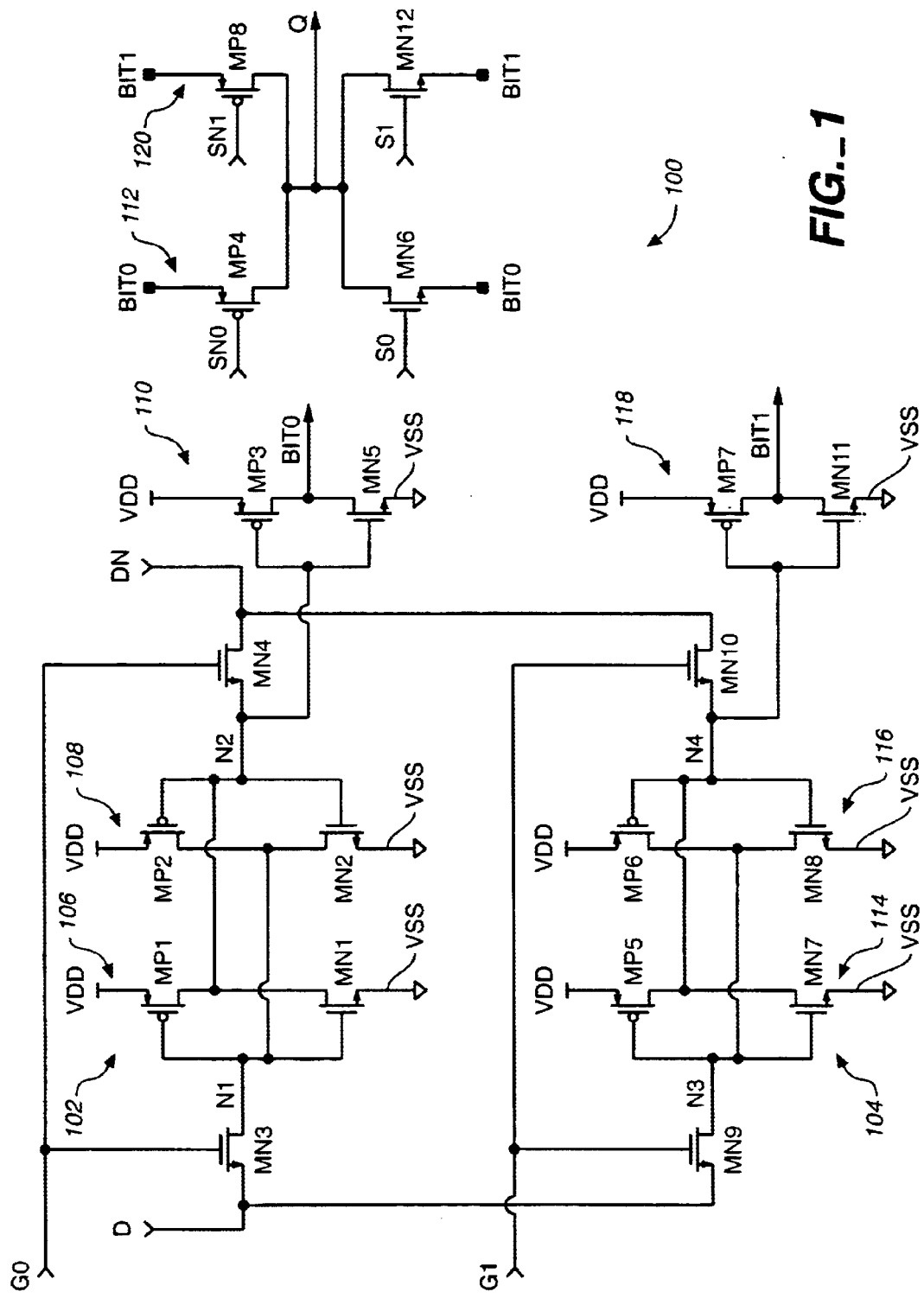
FIG._1

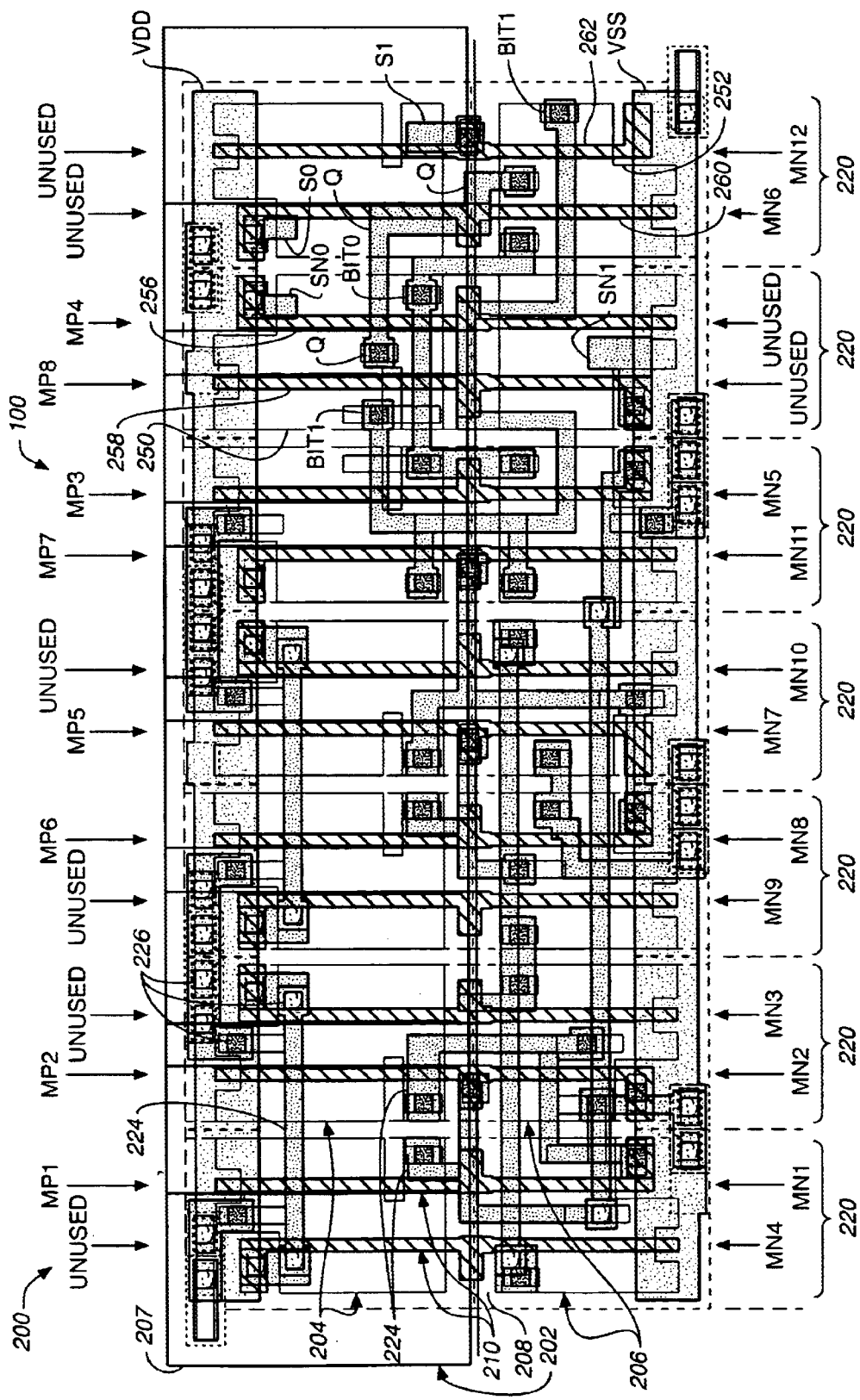
FIG._2

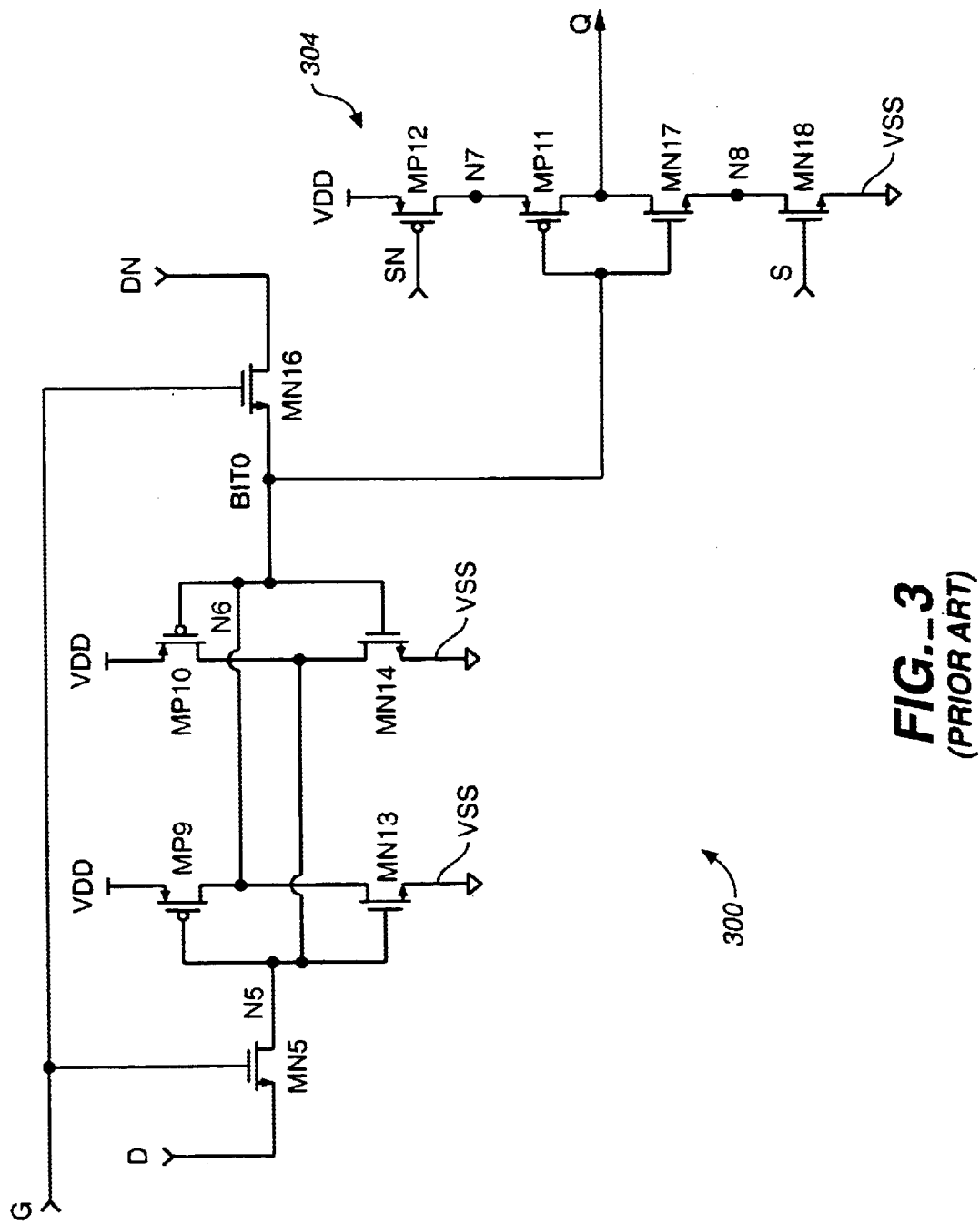
FIG._3
(PRIOR ART)

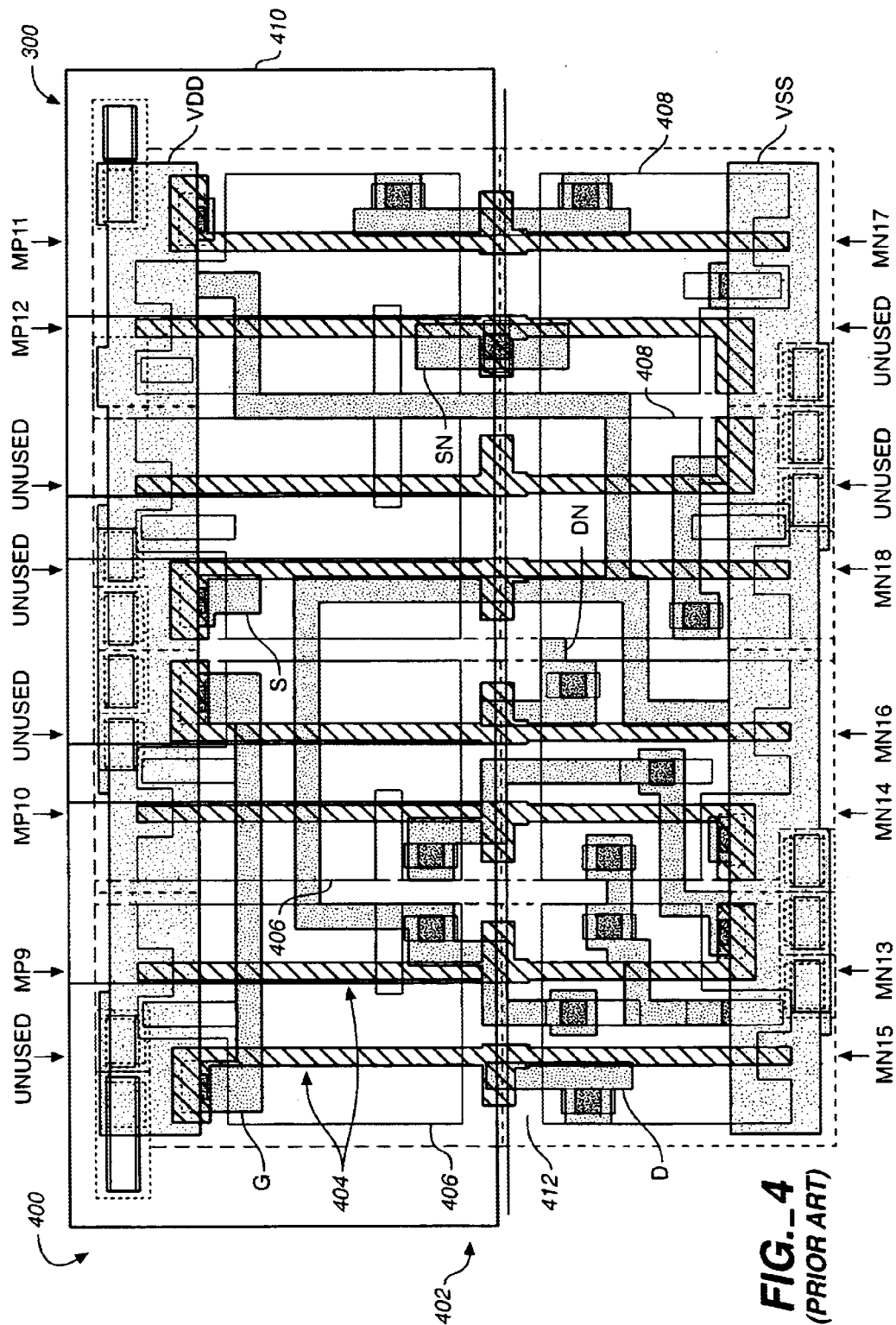
FIG._4
(PRIOR ART)

US 6,800,882 B2

MULTIPLE-BIT MEMORY LATCH CELL FOR INTEGRATED CIRCUIT GATE ARRAY

FIELD OF THE INVENTION

The present invention relates to semiconductor integrated circuits. More specifically, the present invention relates to memory latch cells for use in gate array type integrated circuits.

BACKGROUND OF THE INVENTION

Semiconductor integrated circuit memories have a plurality of memory cells arranged in rows and columns. The area consumed by each memory cell limits the size of memory that can be fabricated on an integrated circuit. This area is determined by the number of transistors in the cell and the physical layout of the transistors on the integrated circuit. It is desirable to have each memory cell consume as little area as possible on the integrated circuit. It is also desirable to have the highest performance in terms of access speed. Read performance is typically limited by the output capacitance and output resistance of the output driver in each memory cell.

Improved memory cells are therefore desired, which consume a smaller area and have a lower output resistance and capacitance. This is particularly true with gate array type integrated circuits, which are known for consuming a larger area and being less optimizable than other semiconductor technologies, such as standard cell integrated circuits. Gate array architectures have a repeated layout pattern of transistors that allows for reduced design and fabrication time but typically results in a less dense and less optimized integrated circuit.

The present invention addresses these and other problems and offers other advantages over the prior art.

SUMMARY OF THE INVENTION

One embodiment of the present invention is directed to a gate array integrated circuit, which includes first and second voltage supply rails and a row of P-channel type transistors and adjacent N-channel type transistors located between first and second voltage supply rails. Adjacent ones of the P-channel and N-channel transistors have common control terminals. A multiple-bit memory cell is fabricated in the row and includes first and second latches, a read output, a first pass gate coupled between the first latch and the read output, and a second pass gate coupled between the second latch and the read output. The first pass gate includes a first one of the P-channel or N-channel transistors. The second pass gate includes a second one of the same type of the P-channel or N-channel transistors. The first and second same type transistors share a common diffusion region.

Another embodiment of the present invention is directed to a multiple-bit memory cell layout definition for a semiconductor gate array. The layout definition includes a row of P-channel type transistors and adjacent N-channel type transistors. Adjacent ones of the P-channel and N-channel type transistors have common control terminals. First and second latches, a read output and first and second pass gates are defined within the row. The first pass gate is coupled between the first latch and the read output and includes a first one of the P-channel or N-channel transistors. The second pass gate is coupled between the second latch and the read output and includes a second one of the same type of the P-channel or N-channel transistors. The first and second same type transistors share a common diffusion region.

BRIEF DESCRIPTION OF THE DRAWINGS

FIG. 1 is a schematic diagram illustrating a multiple-bit memory cell according to one embodiment of the present invention.

FIG. 2 illustrates an integrated circuit layout pattern for the multiple-bit memory cell shown in FIG. 1 according to one embodiment of the present invention.

FIG. 3 is a schematic diagram of a single bit memory gate array memory cell according to the prior art.

FIG. 4 illustrates a layout pattern for the single bit memory cell shown in FIG. 3.

DETAILED DESCRIPTION OF ILLUSTRATIVE EMBODIMENTS

FIG. 1 is a schematic diagram illustrating a multiple-bit memory cell 100 according to one embodiment of the present invention. In this embodiment, memory cell 100 is a two-bit memory cell. However, any other number of bits can also be included in cell 100 in alternative embodiments.

Memory cell 100 includes write enable inputs G0 and G1, a pair of complementary write bit line inputs D and DN, complementary read enable inputs S0 and SN0, and complementary read enable inputs S1 and SN1 and read output Q. Multiple-bit memory cell 100 has a first latch 102 for storing a first bit of data (bit 0) and a second latch 104 for storing a second bit of data (bit 1).

Latch 102 includes a pair of cross-coupled inverters 106 and 108. Inverter 106 includes P-channel transistor MP1 and N-channel transistor MN1. Transistor MP1 has a gate coupled to node N1, a source coupled to voltage supply terminal VDD and a drain coupled to node N2. Transistor MN1 has a gate coupled to node N1, a source coupled to voltage supply terminal VSS and a drain coupled to node N2. Inverter 108 includes P-channel transistor MP2 and N-channel transistor MN2. Transistor MP2 has a gate coupled to node N2, a source coupled to voltage supply terminal VDD and a drain coupled to node N1. Transistor MN2 has a gate coupled to node N2, a source coupled to voltage supply terminal VSS and a drain coupled to node N1. Nodes N1 and N2 serve as complementary inputs/outputs to and from memory latch 102.

Node N1 is coupled to bit line D through a first N-channel write access transistor MN3, and node N2 is coupled to bit line DN through a second N-channel write access transistor MN4. Transistor MN3 has a gate coupled to bit 0 write enable input G0, a source coupled to bit line D and a drain coupled to node N1. Transistor MN4 has a gate coupled to bit 0 write enable input G0, a source coupled to node N2 and a drain coupled to bit line DN. Node N2 is used as a read output, which is coupled to an inverter 110 for driving the value on node N2 to read output Q during a read operation. Inverter 110 includes P-channel transistor MP3 and N-channel transistor MN5. Transistor MP3 has a gate coupled to node N2, a source coupled to VDD and a drain coupled to output BIT0. Transistor MN5 has a gate coupled to node N2, a source coupled to VSS and a drain coupled to output BIT0.

Output BIT0 is coupled to read output Q through a pass gate 112, which is formed by P-channel transistor MP4 and N-channel transistor MN6. Transistor MP4 has a gate coupled to bit 0 read enable input SN0, a source coupled to BIT0 and a drain coupled to read output Q. Transistor MN6 has a gate coupled to bit 0 read enable input S0, a source coupled to BIT0 and a drain coupled to read output Q.

Similarly, memory latch 104 includes a pair of cross-coupled inverters 114 and 116. Inverter 114 includes P-channel transistor MP5 and N-channel transistor MN7. Transistor MP5 has a gate coupled to node N3, a source coupled to voltage supply terminal VDD and a drain coupled to node N4. Transistor MN7 has a gate coupled to node N3, a source coupled to voltage supply terminal VSS and a drain coupled to node N4. Inverter 116 includes P-channel transistor MP6 and N-channel transistor MN8. Transistor MP6 has a gate coupled to node N4, a source coupled to voltage supply terminal VDD and a drain coupled to node N3. Transistor MN8 has a gate coupled to node N4, a source coupled to voltage supply terminal VSS and a drain coupled to node N3. Nodes N3 and N4 serve as complementary inputs/outputs to and from memory latch 104.

Node N3 is coupled to bit line D through an N-channel write access transistor MN9, and node N4 is coupled to bit line DN through an N-channel write access transistor MN10. Transistor MN9 has a gate coupled to bit 1 write enable input G1, a source coupled to bit line D and a drain coupled to node N3. Transistor MN10 has a gate coupled to bit 1 write enable input G1, a source coupled to node N4 and a drain coupled to bit line DN. Node N4 is used as a read output, which is coupled to an inverter 118 for driving the value on node N4 to read output Q during a read operation. Inverter 118 includes P-channel transistor MP7 and N-channel transistor MN11. Transistor MP7 has a gate coupled to node N4, a source coupled to VDD and a drain coupled to output BIT1. Transistor MN11 has a gate coupled to node N4, a source coupled to VSS and a drain coupled to output BIT1.

Output BIT1 is coupled to read output Q through a pass gate 120, which is formed by P-channel transistor MP8 and N-channel transistor MN12. Transistor MP8 has a gate coupled to bit 1 read enable input SN1, a source coupled to BIT1 and a drain coupled to read output Q. Transistor MN12 has a gate coupled to bit 1 read enable input S1, a source coupled to BIT1 and a drain coupled to read output Q.

During a write operation, write bit lines D and DN are driven to complementary logic states by write circuitry (not shown). If latch 102 is to be accessed, write enable input G0 is driven to a logic high state, which turns on write access transistors MN3 and MN4. Nodes N1 and N2 assume complementary logic states depending on the logic states on D and DN. Write enable input G0 is then returned to a logic low state to isolate nodes N1 and N2 from D and DN. Latch 102 therefore stores a single data bit represented by the relative logic states on nodes N1 and N2. If latch 104 is to be accessed, write enable input G1 is driven to a logic high state, and nodes N3 and N4 assume complementary logic states depending on the logic: states on D and DN.

During a read operation, read enable inputs S0 and SN0 or read enable inputs S1 and SN1 are activated, depending on whether latch 102 or 104 is to be accessed. If latch 102 is to be accessed, S0 is driven high, and SN0 is driven low. Transistors MP4 and MN6 in pass gate 112 turn on, thereby coupling BIT0 to read output Q. The logic state on BIT0 is therefore driven onto read output Q. When latch 102 is not being accessed, S0 and SN0 are driven low and high states, respectively, thereby turning off MP4 and MN6. This decouples BIT0 from read output Q.

Similarly if latch 104 is to be accessed, S1 is driven high, and SN1 is driven low. Transistors MP8 and MN12 in pass gate 120 turn on, thereby coupling BIT1 to read output Q. When latch 104 is not being accessed, S1 and SN1 are driven low and high states, respectively, thereby turning off MP8 and MN12. This decouples BIT1 from read output Q.

As described in more detail below, by combining multiple latch cell circuits into a single macro cell the semiconductor area consumed by the macro cell can be more effectively used by sharing cell resources. Further, the access times of each cell can be reduced by reducing the effective capacitance on read output Q (capacitance per bit) through the use of diffusion sharing and by reducing the effective output resistance through the use of the pass gates.

FIG. 2 illustrates an integrated circuit layout pattern 200 for multiple-bit memory cell 100 according to one embodiment of the present invention. Layout 200 includes a row 202 of P-channel and N-channel transistor locations between voltage supply rails VDD and VSS. Transistors MP1–MP8 and MN1–MN12 are fabricated in some of the transistor locations within row 202, while the other locations are unused in this example.

Layout pattern 200 defines a plurality of layers, the outlines of which are superimposed on one another in FIG. 2. The base layers include a plurality of P-type diffusion regions, such as regions 204, a plurality of N-type diffusion regions, such as regions 206, an N-type well region 207, a substrate 208, and a plurality of polysilicon gate regions, such as regions 210. The gate of each transistor is defined by the region at which polysilicon gate regions 210 overlap diffusion regions 204 and 206. For simplicity, not all regions are labeled with reference numerals. In this embodiment, the base layers are arranged in base units 220, wherein adjacent base units 220 along row 202 are mirror images of one another.

Layout pattern 200 is a. "gate array" type pattern in which each polysilicon gate region 210 extends from each P-type diffusion region 204 to the adjacent N-type diffusion region 206 in row 202. Therefore, adjacent ones of the P-channel and N-channel transistors in row 202 have common gate regions (i.e., control terminals) 210. This is in contrast to other types of integrated circuit layout patterns, such as standard cells. In standard cells, laterally adjacent N-channel and P-channel transistors have separate gate regions and separate gate output contacts.

Layout pattern 200 further includes one or more metal layers in which a plurality of conductive segments 224 are routed. Contacts 226 indicate connections between layers in the cell. A contact 226 overlapping a voltage supply rail VDD or VSS indicates a connection between the supply rail and the well 207 or the substrate 208. A contact overlapping a polysilicon region 210 or a conductive segment 224 and a voltage supply rail indicates a connection between that polysilicon region 210 or conductive segment 224 and the supply rail. A contact overlapping a diffusion region 204 or 206 and a conductive segment 224 indicates a connection between the conductive segment and the corresponding diffusion region. Similarly, a contact overlapping a polysilicon region 210 and a conductive segment 224 indicates a connection between those two layers. The layers are interconnected with conductive segments 224 and contacts 226 to form the circuit shown in FIG. 1.

In order to reduce output capacitance, layout pattern 200 is arranged such that P-channel transistors MP4 and MP8 share a common P-type diffusion region and N-channel transistors MN6 and MN12 share a common N-type diffusion region 252. P-channel transistor MP4 has a polysilicon gate region 256, which is coupled to read enable input SN0, a source coupled to BIT0 and a drain coupled to read output Q. P-channel transistor MP8 has a polysilicon gate region 258, which is coupled to read enable input SN1, a source coupled to BIT1 and a drain coupled to read output Q. N-channel transistor MN6 has a polysilicon gate region 260 coupled to read enable input S0, a source coupled to BIT0 and a drain coupled to read output Q. N-channel transistor MN12 has a polysilicon gate region 262 coupled to read enable input S1, a source coupled to BIT1 and a drain coupled to read output Q.

In order for transistors MP4 and MP8 and transistors MN6 and MN12 to share common diffusion regions within a gate array layout where the polysilicon gate regions extend across both the N+ and P+ diffusion regions, the N-channel and P-channel transistor of each pass gate 112 and 120 are offset from one another along row 202. For example, P-channel transistor MP4 is non-adjacent to N-channel transistor MN6 across row 202. Similarly, P-channel transistor MP8 is non-adjacent to N-channel transistor MN12 across row 202. In this example, the transistor structures adjacent to transistors MP4, MP8, MN6 and MN12 across row 202 are unused.

Since transistor MP4 shares a common diffusion region 250 with transistor MP8 and transistor MN6 shares a common diffusion region 252 with transistor MN12, layout pattern 200 consumes a rectangular area on the integrated circuit having a width of two transistor locations across row 202 and a length along row 202 of 14 transistor locations. If pass gates 112 and 120 were constructed with only a single transistor each, then the layout pattern 200 would require a length of only twelve transistor locations along row 202.

As described in more detail below with reference to FIGS. 3 and 4, the area consumed by layout pattern 200 represents a savings of ⅛ of the area consumed by two single-bit memory cells. This translates into a smaller area per bit and therefore a significant reduction in the size of the overall memory. Also, the performance of, multiple-bit memory cell 100 is increased by reducing the effective bit line capacitance (capacitance per bit) through the use of diffusion sharing on read output Q. Read output Q is coupled to only two diffusion regions 250 and 252 as compared to four diffusion regions if the regions were not shared. This increases the speed at which read output Q can be charged and discharged during read operations. In FIG. 2, read output Q is coupled to only two diffusion regions for every two memory bits.

FIG. 3 is a schematic diagram of a single-bit memory cell 300 for a gate array semiconductor device according to the prior art. Memory cell 300 includes write enable input G, complementary write bit lines D and DN, complementary read enable inputs S and SN, and read output Q. Memory cell 300 further includes N-channel transistors MN13–MN18 and P-channel transistors MP9–MP12. P-channel transistors MP9 and MP10 and N-channel transistors MN13 and MN14 are coupled together to form a pair of cross-coupled inverters that operate as a latch 302. Latch 302 is biased between voltage supply terminals VDD and VSS and has complementary inputs/output nodes N5 and N6. Node N5 is coupled to bit line D through write access transistor MN15, and node N6 is coupled to bit line DN through write access MN16. Transistors MN15 and MN16 have gates coupled to write enable input G. Node N6 defines a read output, BIT0, which is coupled to read output Q through tri-state driver 304.

Tri-state driver 304 includes P-channel transistors MP11 and MP12 and N-channel transistors MN17 and MN18. Transistors MP11 and MN17 form an inverter that is enabled and disabled by transistors MP12 and MN18. Transistors MP12 and MN18 have gates coupled to read enable inputs SN and S, respectively. When MP12 and MN18 are enabled and BIT0 is high, MP11 is off, MN17 is on and read output Q is discharged to a low state.

The output capacitance on read output Q is equal to the capacitance at the drain of transistor MN17 plus the capacitance on node N8. This adversely affects the performance of the memory since both nodes need to be charged or discharged when doing a read operation. Also, the effective output capacitance on read output Q is a function of the state of BIT0. If BIT0 is low, the output capacitance is equal to the capacitance at the drain of MP11 plus the capacitance on node N7. This makes the output capacitance much more difficult to model and simulate during design verification.

Another disadvantage of the circuit shown in FIG. 3 is that the effective output resistance on read output Q is much higher than that in FIG. 1. In FIG. 3, the effective output resistance when BIT0 is high is equal to the sum of the resistances through transistors MN17 and MN18. If each of these resistances is "R", then the effective output resistance, $R_{eff}$, is $R_{eff}=2R$. In FIG. 1, the effective output resistance $R_{eff}$ is equal to the resistance through transistor MN5 plus the parallel combination of the resistances through transistors MP4 and MN6. The total effective output resistance for the circuit shown in FIG. 1 is therefore less than the effective output resistance of the circuit shown in FIG. 3. Reducing the effective output resistance increases the drive strength of the memory cell. This represents a further performance advantage for the circuit shown in FIG. 1.

FIG. 4 illustrates a layout pattern 400 for the single-bit memory cell 300 shown in FIG. 3. Layout pattern 400 includes a row 402 of N-channel and P-channel transistor structures for forming N-channel transistors MN13–MN18 and P-channel transistors MP9–MP12, which are biased between voltage supply rails VDD and VSS. Again, several of the transistor structures are unused in pattern 400. The transistors structures in row 402 have polysilicon gate regions 404, P-type diffusion regions 406, N-type diffusion regions 408, well region 410 and substrate 412.

Layout pattern 400 consumes an area on the integrated circuit having a width of two transistor locations across row 402 and a length of eight transistor locations along row 402. Therefore, every two memory cells in a memory fabricated with multiple instances of layout pattern 400 would consume 16 transistor locations along row 402. This area is two transistor locations longer than layout pattern 200 (shown in FIG. 2). Therefore, by combining two single-bit memory cells into a single macro cell and arranging the layout such that the pass gate transistors share diffusion regions, the area consumed by the macro cell can be reduced significantly as compared to two of the single-bit layout patterns shown in FIG. 4.

Although the present invention has been described with reference to illustrative embodiments, workers skilled in the art will recognize that changes may be made in form and detail without departing from the spirit and scope of the invention. For example, the arrangement and locations of the individual transistors relative to one another can be varied in alternative embodiments of the present invention. Also, the routing of the conductive segments and the locations of particular contacts can be rearranged in alternative embodiments of the present invention. The layout pattern shown in FIG. 4 is provided as an example only. Transistors can be added or eliminated to add or eliminate functions. The memory cell circuit can be inverted relative to the voltage supply rails. Further, more than two memory cells can be combined with one another as a single macro cell, where similar-type output transistors share a common diffusion region. In addition, the memory cell, itself, and the manner in which read and write operations are enabled can be modified in alternative embodiments. The term "coupled" used in the specification and claims can include a direct connection or a connection through one or more intermediate components.

What is claimed is:

1. A gate array integrated circuit comprising:
   first and second voltage supply rails;
   a row of P-channel type transistors and adjacent N-channel type transistors, which are located between first and second voltage supply rails, wherein adjacent ones of the P-channel and N-channel transistors have common control terminals; and
   a multiple-bit memory cell fabricated in the row and comprising first and second latches, a read output, a first pass gate coupled between the first latch and the read output, and a second pass gate coupled between the second latch and the read output, wherein the first pass gate comprises a first one of the P-channel or N-channel transistors, the second pass gate comprises a second one of the same type of the P-channel or N-channel transistors, and the first and second same type transistors share a common diffusion region.

2. The gate array integrated circuit of claim 1 wherein:
   the first and second same type transistors are P-channel type transistors;
   the first pass gate further comprises a first one of the N-channel type transistors; and
   the second pass gate comprises a second one of the N-channel type transistors, and the first and second N-channel type transistors share a common diffusion region.

3. The gate array integrated circuit of claim 2 wherein:
   the first P-channel transistor is non-adjacent to the first N-channel transistor across the row; and
   the second P-channel transistor is non-adjacent to the second N-channel transistor across the row.

4. The gate array integrated circuit of claim 2 wherein each of the P-channel and N-channel transistors is fabricated in a transistor location along the row and the multiple-bit memory cell consumes a rectangular area on the integrated circuit having a width of two transistor locations and a length along the row of at most fourteen transistor locations.

5. The gate array integrated circuit of claim 1 wherein each of the P-channel and N-channel transistors is fabricated in a transistor location along the row and the multiple-bit memory cell consumes a rectangular area on the integrated circuit having a width of two transistor locations and a length along the row of at most twelve transistor locations.

6. The gate array integrated circuit of claim 1 wherein the multiple-bit memory cell further comprises:
   a first inverter coupled between the first latch and the first pass gate; and
   a second inverter coupled between the second latch and the second pass gate.

7. The gate array integrated circuit of claim 1 wherein the multiple-bit memory cell further comprises:
   a first read enable input coupled to the control terminal of the first P-channel or N-channel transistor of the first pass gate; and
   a second read enable input coupled to the control terminal of the second P-channel or N-channel transistor of the second pass gate.

8. The gate array integrated circuit of claim 1 wherein the multiple-bit memory cell further comprises:
   first and second complementary write bit line inputs;
   first and second write access transistors coupled between the first and second write bit line inputs, respectively, and the first latch;
   third and fourth write access transistors coupled between the first and second write bit line inputs, respectively, and the second latch;
   a first write enable input coupled to control terminals of the first and second write access transistors; and
   a second write enable input coupled to control terminals of the third and fourth write access transistors.

9. A multiple-bit memory cell layout definition for a semiconductor gate array, the layout definition comprising:
   a row of P-channel type transistors and adjacent N-channel type transistors, wherein adjacent ones of the P-channel and N-channel type transistors have common control terminals;
   first and second latches defined within the row;
   a read output defined within the row;
   a first pass gate defined within the row and coupled between the first latch and the read output; and
   a second pass gate defined within the row and coupled between the second latch and the read output, wherein the first pass gate comprises a first one of the P-channel or N-channel transistors, the second pass gate comprises a second one of the same type of the P-channel or N-channel transistors, and the first and second same type transistors share a common diffusion region.

10. The layout definition of claim 9 wherein:

the first and second same type transistors are P-channel type transistors;

the first pass gate further comprises a first one of the N-channel type transistors; and the second pass gate comprises a second one of the N-channel type transistors, and the first and second N-channel type transistors share a common diffusion region.

11. The layout definition of claim 10 wherein:

the first P-channel transistor is non-adjacent to the first N-channel transistor across the row; and the second P-channel transistor is non-adjacent to the second N-channel transistor across the row.

12. The layout definition of claim 10 wherein each of the P-channel and N-channel transistors has a transistor location along the row and the multiple-bit memory cell consumes a rectangular area having a width of two transistor locations and a length along the row of at most fourteen transistor locations.

13. The layout definition of claim 9 wherein each of the P-channel and N-channel transistors has a transistor location along the row and the multiple-bit memory cell consumes a rectangular area having a width of two transistor locations and a length along the row of at most twelve transistor locations.

14. The layout definition of claim 9 and further comprising:

a first inverter defined in the row and coupled between the first latch and the first pass gate; and a second inverter defined in the row and coupled between the second latch and the second pass gate.

15. The layout definition of claim 9 and further comprising:

a first read enable input defined in the row and coupled to the control terminal of the first P-channel or N-channel transistor of the first pass gate; and a second read enable input defined in the row and coupled to the control terminal of the second P-channel or N-channel transistor of the second pass gate.

16. The layout definition of claim 9 and further comprising:

first and second complementary write bit line inputs defined in the row;

first and second write access transistors defined in the row and coupled between the first and second write bit line inputs, respectively, and the first latch;

third and fourth write access transistors defined in the row and coupled between the first and second write bit line inputs, respectively, and the second latch;

a first write enable input defined in the row and coupled to control terminals of the first and second write access transistors; and a second write enable input defined in the row and coupled to control terminals of the third and fourth write access transistors.

* * * * *